(12) United States Patent
Chen

(10) Patent No.: US 6,524,730 B1
(45) Date of Patent: Feb. 25, 2003

(54) NIFE-CONTAINING SOFT MAGNETIC LAYER DESIGN FOR MULTILAYER MEDIA

(75) Inventor: Ga-Lane Chen, Fremont, CA (US)

(73) Assignee: Seagate Technology, LLC, Scotts Valley, CA (US)

( * ) Notice: Subject to any disclaimer, the term of this patent is extended or adjusted under 35 U.S.C. 154(b) by 23 days.

(21) Appl. No.: 09/637,909

(22) Filed: Aug. 14, 2000

Related U.S. Application Data

(60) Provisional application No. 60/166,649, filed on Nov. 19, 1999.

(51) Int. Cl.[7] .............................. G11B 5/66; G11B 5/70; C23C 14/06; C23C 14/34; C23C 14/14
(52) U.S. Cl. ............................ 428/694 TM; 428/213; 428/336; 428/900; 204/192.1; 204/192.12; 204/192.15; 204/192.2
(58) Field of Search .................... 428/694 TM, 694 TS, 428/900, 213, 336; 204/192.2, 192.1, 192.12, 192.15

(56) References Cited

U.S. PATENT DOCUMENTS

| 4,103,315 | A | 7/1978 | Hempstead et al. ........ 360/110 |
| 5,439,754 | A | 8/1995 | Iwasaki et al. ............. 428/692 |
| 5,486,967 | A | 1/1996 | Tanaka et al. ............... 360/113 |
| 5,492,605 | A | 2/1996 | Pinarbasi ................ 204/192.11 |
| 5,543,989 | A | 8/1996 | Westwood ................... 360/113 |
| 5,576,085 | A | 11/1996 | Lal et al. ..................... 428/65.3 |
| 5,589,262 | A | 12/1996 | Kiuchi et al. ................ 428/336 |
| 5,652,054 | A | 7/1997 | Kikitsu et al. .............. 428/328 |
| 5,750,270 | A | 5/1998 | Tang et al. .................. 428/611 |
| 5,997,698 | A | 12/1999 | Mino et al. ............... 204/192.2 |
| 5,999,375 | A | 12/1999 | Forbord et al. ............. 360/106 |
| 6,023,397 | A | 2/2000 | Mino et al. .................. 360/126 |
| 6,051,304 | A | 4/2000 | Takahashi .................... 428/141 |
| 6,052,261 | A | 4/2000 | Watanabe et al. ........... 360/113 |

OTHER PUBLICATIONS

Shih et al., "Properties of NiFe–N films prepared by rf sputtering in nitrogen–argon gas mixtures", Jun. 1992, J. Appl. Phys., vol. 71 (11), pp. 5539–5542.*

* cited by examiner

*Primary Examiner*—Holly Rickman
(74) *Attorney, Agent, or Firm*—Morrison & Foerster LLP

(57) ABSTRACT

A multilayer superlattice having a structure with many interfaces of magnetic/non-magnetic layers could increase the coercivity of a magnetic recording medium by increasing the interfacial anisotropy. A soft magnetic layer comprising interstitial nitrogen between the substrate and the multilayer superlattice reduces the surface roughness between the substrate magnetic layer. This in turn reduces the fly height and boosts the coercivity of the magnetic recording medium.

19 Claims, 2 Drawing Sheets

NIFE-CONTAINING SOFT MAGNETIC LAYER DESIGN FOR MULTILAYER MEDIA

RELATED APPLICATIONS

This application claims priority from provisional 60/166,649 filed Nov. 19, 1999, entitled "Special NiFe Deposition Process To Reduce Surface Roughness And Fly Height Of Multilayer Media," the entire disclosure of which is hereby incorporated herein by reference.

CROSS REFERENCE TO RELATED APPLICATIONS

This application discloses subject matter related to subject matter disclosed in co-pending U.S. patent applications: Ser. No. 09/496,341, filed on Feb. 2, 2000; Ser. No. 09/634,253, filed Aug. 7, 2000; Ser. No. 09/612,319, filed on Jul. 7, 2000; Ser. No. 09/433,377, filed on Nov. 3, 1999 now U.S. Pat. No. 6,268,075; Ser. No. 09/433,375, filed on Nov. 3, 1999 now U.S. Pat. No. 6,381,200; Ser. No. 60/109,230, filed on Nov. 18, 1998; Ser. No. 09/433,378, filed on Nov. 3, 1999 now U.S. Pat. No. 6,324,181; and Ser. No. 09/421,393, filed on Oct. 20, 1999, now U.S. Pat. No. 6,335,063, incorporated herein by reference.

TECHNICAL FIELD

The present invention relates to the recording, storage and reading of magnetic data, particularly rotatable recording media, such as thin film magnetic disks having smooth surfaces for data zone. The invention has particular applicability to high density recording media exhibiting low noise and having improved flying stability, glide performance and head-media interface reliability for providing zero glide hits.

BACKGROUND ART

The requirements for high areal density impose increasingly greater requirements on magnetic recording media in terms of coercivity, remanent squareness, low medium noise and narrow track recording performance. Data are written onto and read from a rapidly rotating recording disk by means of a magnetic head transducer assembly that flies closely over the surface of the disk.

It is considered desirable during reading and recording operations to maintain each transducer head as close to its associated recording surface as possible, i.e., to minimize the flying height of the head. This objective becomes particularly significant as the areal recording density increases. The areal density (Mbits/in$^2$) is the recording density per unit area and is equal to the track density (TPI) in terms of tracks per inch times the linear density (BPI) in terms of bits per inch.

The increasing demands for higher areal recording density impose increasingly greater demands on flying the head lower because the output voltage of a disk drive (or the readback signal of a reader head in disk drive) is proportional to 1/exp(HMS), where HMS is the space between the head and the media. Therefore, a smooth recording surface is preferred, as well as a smooth opposing surface of the associated transducer head, thereby permitting the head and the disk to be positioned in closer proximity with an attendant increase in predictability and consistent behavior of the air bearing supporting the head.

In recent years, considerable effort has been expended to achieve high areal recording density. Among the recognized significant factors affecting recording density are magnetic remanance (Mr), coercivity, coercivity squareness (S*), signal/noise ratio, and flying height, which is the distance at which a read/write head floats above the spinning disk. Prior approaches to achieve increased areal recording density for longitudinal recording involve the use of dual magnetic layers separated by a non-magnetic layer as in Teng et al., U.S. Pat. No. 5,462,796, and the use of a gradient magnetic layer interposed between two magnetic layers as in Lal et al., U.S. Pat. No. 5,432,012.

However, the goal of achieving a rigid disk recording medium having an areal recording density of about 100 Gb/in$^2$ has remained elusive. In particular, the requirement to further reduce the flying height of the head imposed by increasingly higher recording density and capacity renders the disk drive particularly vulnerable to head crash due to accidental glide hits of the head and media. To avoid glide hits, an accurately controlled movement of the head and a smooth surface of data zone are desired.

It is extremely difficult to produce a magnetic recording medium satisfying such demanding requirements, particularly a high-density magnetic rigid disk medium for longitudinal and perpendicular recording. The magnetic anisotropy of longitudinal and perpendicular recording media makes the easily magnetized direction of the media located in the film plane and perpendicular to the film plane, respectively. The remanent magnetic moment of the magnetic media after magnetic recording or writing of longitudinal and perpendicular media is located in the film plane and perpendicular to the film plane, respectively.

In theory, perpendicular media is capable of considerably higher linear data density. Generally, this possibility stems from the fact that information is stored in perpendicular media in discrete domains having opposite magnetization to the magnetization found in the surrounding areas. Such domains can potentially reside in crystals in the media. Typically the information is read from the media through use of a magnetic head that converts local discontinuities present in the discrete domains of perpendicular magnetization into electrical fields which can then be processed as information.

However, between the discrete domains of magnetization, magnetization parallel to the surface of the media, or sub-domains or opposite magnetization, are usually present. This is particularly true in situations where remanent magnetization of a layer is significantly smaller than the saturation magnetization of the media. In such situations, the transitions between the domains can cause undesirable electronic signals stemming from, essentially, magnetic noise.

Several terms that are important in describing magnetic recording media are explained below. Coercivity essentially refers to how firmly the media holds a particular orientation of magnetization. For example, how much energy is required to cause a crystal in the media to change orientation. On a magnetization hysteresis (M-H) curve, the required applied magnetic field to reduce the magnetization of the material to zero is called coercivity Hc. Permeability ($\mu$) is equal to B/H, where B is the flux density and H is the applied magnetic field.

The easy axis of magnetization of a crystal is the direction of spontaneous domain magnetization in the demagnetized state. The direction of the easy axis of magnetization can be detected on M-H curves. Along the easy axis of magnetization, the M-H curve is forms a square. Along the hard axis direction, the M-H curve is skewed.

Anisotropy refers to the energy stored in a crystal by virtue of the work done in rotating the magnetization of a domain of the crystal away from the easy axis of magnetization. Output basically refers to the strength of the flux created by the media to read the media. Media noise comes from the recording medium. When a magnetic pulse and a transition is written during recording, there is a noise when the signal is being readback.

Some materials change dimension when exposed to a magnetic field. This effect is called magnetostriction. Most NiFe compositions exhibit magnetostriction, except the composition of $Ni_{81}Fe_{19}$.

A multilayer superlattice has a structure with many interfaces of magnetic/non-magnetic layers. A bilayer superlattice [A/B]n has n bilayers stacked together to form a superlattice, e.g., [Co/Pt]n, [Co/Pd]n, [CoX/Pt]n, [CoX/Pd]n, where X=Cr, B, etc. The thickness of layers A and B can vary from about 3 Å to about 10 Å and from about 5 Å to about 20 Å, respectively.

A soft magnetic layer (also referred as "keeper layer") is a layer on the substrate of a magnetic recording medium that gives better writing efficiency by pulling the magnetic flux down from the writing pole of a head of the magnetic recording medium. Soft magnetic layers are made of soft magnetic materials. Soft magnetic material is one of the two kinds of commonly available magnetic materials. One kind has a high coercivity and is called hard magnetic material, e.g., CoCr, CoCrTa and CoCrPt. Because it has high coercivity, it is "hard" to change the magnetization direction unless a strong reverse magnetic field is applied. Another kind is has a very low coercivity in the range of 0.1 Oe to 500 Oe and is called a soft magnetic material, e.g., NiFe, CoZrNb, FeAlNx. Because it has a low coercivity, it is easy ("soft") to change the magnetization direction with a very small reverse magnetic field. "Hard" and "soft" magnetic materials in the context of this invention are not related to mechanical softness or hardness of the material.

In order to undertake perpendicular recording, it is necessary to utilize a magnetic recording media having perpendicular anisotropy. Perpendicular anisotropy is essentially due to a crystal structure of the magnetic material that creates a magnetic moment perpendicular to the surface of the media. One typical perpendicular magnetic material is the alloy cobalt-chromium (CoCr).

A substrate material conventionally employed in producing magnetic recording rigid disks comprises an aluminum-magnesium (Al—Mg) alloy. Such Al—Mg alloys are typically electrolessly plated with a layer of NiP at a thickness of about 15 microns to increase the hardness of the substrates, thereby providing a suitable surface for polishing to provide the requisite surface roughness or texture.

Other substrate materials have been employed, such as glass, e.g., an amorphous glass, glass-ceramic material which comprise a mixture of amorphous and crystalline materials, and ceramic materials. Glass-ceramic materials do not normally exhibit a crystalline surface. Glasses and glass-ceramics generally exhibit high resistance to shocks.

A conventional longitudinal recording disk medium is depicted in FIG. 1 and typically comprises a non-magnetic substrate 10 having sequentially deposited on each side thereof an underlayer 11, 11', such as chromium (Cr) or Cr-alloy, a magnetic layer 12, 12', typically comprising a cobalt (Co)-base alloy, and a protective overcoat 13, 13', typically containing carbon. Conventional practices also comprise bonding a lubricant topcoat (not shown) to the protective overcoat. Underlayer 11, 11', magnetic layer 12, 12', and protective overcoat 13, 13', are typically deposited by sputtering techniques. The Co-base alloy magnetic layer deposited by conventional techniques normally comprises polycrystallites epitaxially grown on the polycrystal Cr or Cr-alloy underlayer. A conventional perpendicular recording disk medium is similar to the longitudinal recording medium depicted in FIG. 1, but does not comprise Cr-containing underlayers.

Conventional methods for manufacturing longitudinal magnetic recording medium with a glass or glass-ceramic substrate comprise applying a seed layer between the substrate and underlayer. A conventional seed layer seeds the nucleation of a particular crystallographic texture of the underlayer.

Conventional Cr-alloy underlayers comprise vanadium (V), titanium (Ti), tungsten (W) or molybdenum (Mo). Other conventional magnetic layers are CoCrTa, CoCrPtB, CoCrPt, CoCrPtTaNb and CoNiCr.

The seed layer, underlayer, and magnetic layer are conventionally sequentially sputter deposited on the substrate in an inert gas atmosphere, such as an atmosphere of pure argon. A conventional carbon overcoat is typically deposited in argon with nitrogen, hydrogen or ethylene. Conventional lubricant topcoats are typically about 20 Å thick.

Tang et al., U.S. Pat. No. 5,750,270, discloses multi-layer magnetic recording media incorporating a soft magnetic layer for better writing efficiency. Tang et al. discloses that NiFe with very low magnetostriction, low coercivity, and high permeability is one of the preferred materials as the soft magnetic layer for perpendicular recording. The thickness of the soft magnetic layer may require to be as thick as 5000 Å. However, this inventor found that with the conventional sputtering process using Argon sputter gas, the surface roughness increases as the thickness of NiFe increases. In particular, when the thickness of the Argon sputtered NiFe layer is about 5000 Å, the surface roughness of the NiFe layer is high, which causes the top surface of media to also have a high roughness. This in turn could cause head crash due to accidental glide hits of the head and media.

Therefore, there exists a need for technology enabling the use of a structure that could increase the medium coercivity by increasing the interfacial anisotropy and provide a smooth topography of the soft magnetic layer of a recording medium.

SUMMARY OF THE INVENTION

During the course of the present invention, it was found that a multilayer magnetic recording medium comprising a multilayer superlattice could have a smooth topography of the soft magnetic layer of a recording medium by using a special process for thick NiFe deposition. This process can reduce surface roughness of thin films remarkably, as well improve the soft magnetic properties of NiFe keeper layer. Therefore, the glide height performance could be improved.

This inventor unexpectedly discovered that the presence of interstitial nitrogen in a soft magnetic layer greatly reduces the surface roughness of the soft magnetic layer as compared to another soft magnetic layer without interstitial nitrogen. "Interstitial nitrogen" refers to nitrogen within the interstices of the soft magnetic layer. Interstitial nitrogen is different from nitrogen in the material forming the soft magnetic layer. For example, FeAlNx is a soft magnetic material but nitrogen of FeAlNx is not interstitial nitrogen. Interstitial nitrogen could be nitrogen by itself or nitrogen of a nitrogen-containing material that is not a soft magnetic material.

In particular, with the sputtering gas ratio Ar/Nitrogen at 90:10 (i.e. 10% of nitrogen concentration), the coercivity on the NiFe could be improved from a few hundred oersted (which sputtered with pure argon gas) to only a few oersted in the direction of easy axis of magnetization. The process with Ar/nitrogen mixture gas could also reduce the surface roughness of NiFe film by half.

The present invention is a magnetic recording medium comprising a substrate, a multilayer superlattice comprising a magnetic layer and a non-magnetic layer and a soft magnetic layer comprising interstitial nitrogen interposed between the substrate and the multilayer superlattice.

An embodiment of the present invention is a method of manufacturing a magnetic recording medium, the method comprising sputter depositing a soft magnetic layer comprising interstitial nitrogen on a substrate; and sputter depositing a multi layer superlattice comprising a magnetic layer and a non-magnetic layer on the soft magnetic layer.

Another embodiment of this invention is a magnetic recording medium comprising a substrate; a multilayer superlattice comprising a magnetic layer and a non-magnetic layer and a soft magnetic layer interposed between the substrate and the multilayer superlattice, wherein the soft magnetic layer comprises a means for reducing the surface roughness of the soft magnetic layer. Embodiments of the means for reducing the surface roughness of the soft magnetic layer include, but are not limited to, interstitial nitrogen or any other material in the soft magnetic layer, wherein the other material is capable of causing the soft magnetic layer to have a smooth surface. For example, the other material could be a lubricant or an additive in the soft magnetic layer.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims. As will be realized, the present invention is capable of other and different embodiments, and its several details are capable of modifications in various obvious respects, all without departing from the present invention. The drawings and description are to be regarded as illustrative in nature, and not as restrictive.

DESCRIPTION OF THE INVENTION

Figure 1:
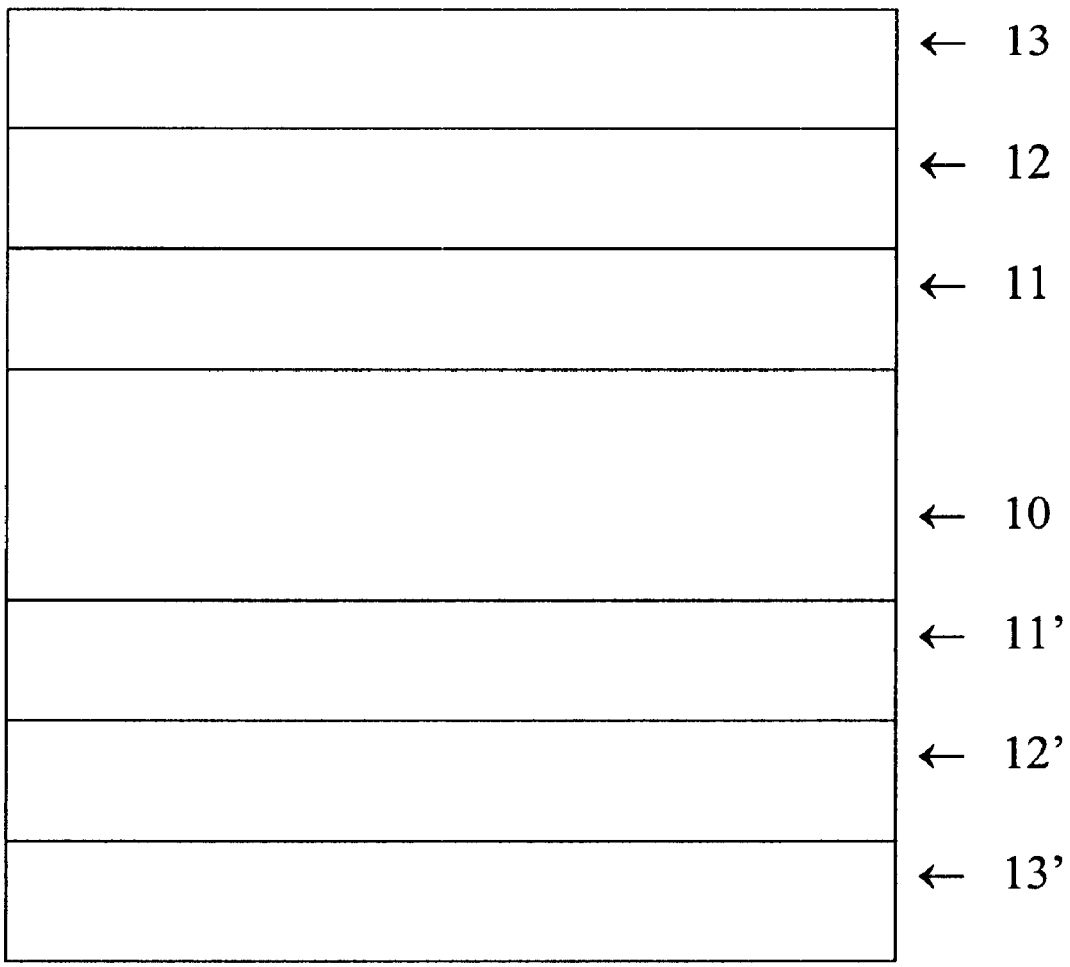
FIG. 1 schematically shows a conventional magnetic recording medium structure (Prior Art).

The present invention enables the manufacture of magnetic recording media comprising a multilayer superlattice and exhibiting high coercivity and low surface roughness of the soft magnetic layer. This media is suitable for high density longitudinal and perpendicular magnetic recording. The anisotropy of the media could be increased by multilayer interfacial anisotropy while the surface roughness of the soft magnetic layer could be reduced by the presence of interstitial nitrogen in the soft magnetic layer.

These objects of this invention are achieved in accordance with the embodiments by strategically forming a soft magnetic layer comprising interstitial nitrogen on a substrate of media comprising the multilayer superlattice. The soft magnetic layer could be sputter deposited directly on the substrate or on a soft underlayer located on the substrate. In another embodiment, the soft magnetic layer could be coated.

Embodiments of the substrate include any substrate made of a glass or glass-ceramic, NiP/Al, metal alloys, plastic/polymer material, ceramic, glass-polymer, composite materials or other non-magnetic materials.

In one embodiment, the soft magnetic layer has a coercivity of about 0.1 Oe to about 50 Oe, preferably 0.15 Oe to 10 Oe, along an easy axis of magnetization.

In one embodiment, the magnetic medium could have a coercivity of more than 2000 Oe, more preferably more than 3000 Oe, and most preferably more than 4000 Oe. The media could have a coercivity of 5000 Oe or more. The multilayer superlattice could comprise 5 to 100 bilayers of the magnetic layer and the non-magnetic layer, more preferably 10 to 80 bilayers, and most preferably 20 to 50 bilayers. The bilayers could be Co/Pd bilayers or Co/Pt bilayers or CoCr/Pd bilayers, or CoCrB/Pd bilayers. The magnetic layer could have a thickness of about 2 Å to about 10 Å, more preferably about 3 Å to about 8 Å, most preferably about 4 Å to about 6 Å. The non-magnetic layer could have a thickness of about 3 Å to about 20 Å, more preferably about 5 Å to about 15 Å, most preferably about 8 Å to about 12 Å. The soft magnetic layer could advantageously be deposited at a total thickness of about 100 Å to about 10,000 Å, preferably about 500 Å to about 5,000 Å, most preferably about 1,000 Å to about 3,000 Å. The soft magnetic layer could be sputter deposited employing a target containing Ni and Fe, of which the target preferably contains more Ni than Fe. Optionally, one or more elements such as B, W, Ta, Zr, P, Pd, Co, Cr, and Nb could be included in target. The magnetic recording medium could further comprise an underlayer and/or a seedlayer above or below the soft magnetic layer. The underlayer and/or seedlayer could be NiFe, $FeAl_xN_y$, FeAlSi, CrZrNb, CoNiFe and any combination of the above. In a preferred embodiment of the magnetic recording medium, the substrate could be a glass substrate or an aluminum substrate, the magnetic layer could be a Co-containing layer and the non-magnetic layer could be a Pd-containing layer.

In one embodiment, the soft magnetic layer is a sputtered NiFe film comprising the interstitial nitrogen and the sputtered NiFe film has a decreasing surface roughness with an increasing power density of a NiFe target for sputtering said NiFe film.

Embodiments of the present invention also comprises surface oxidizing a layer of the recording medium. A surface-oxidized layer is one having more than 0.5 at. % oxygen in a top 50 Å region after in-situ sputter removal of a 40 Å surface layer. In a preferred embodiment, the surface-oxidized layer has more than 10 at. % oxygen in the top 50 Å region after in-situ sputter removal of a 40 Å surface layer. The surface of the soft magnetic layer itself could be oxidized.

Embodiments of the present invention also comprise forming an adhesion enhancement layer, such as Cr or Cr alloy or Ti or Ti alloy, between the soft magnetic layer and the substrate. An adhesion enhancement layer is a sputter-deposited thin film layer in the thickness range of 15 Å to 100 Å that creates a better adhesion between underlayer and substrate. In a preferred embodiment, the adhesion enhancement layer is a sputter-deposited thin film layer in the thickness range of 25 Å to 75 Å.

Embodiments of the present invention comprise sputter-depositing an adhesion enhancement layer that is substantially Cr or a Cr alloy. Suitable Cr alloys include Cr and up to about 30 at. %, e.g., up to about 20 at. % of an alloying element, such as titanium and vanadium. Advantageously, the present invention could be easily integrated into existing production facilities in a cost effective manner, in that the adhesion enhancement could be sputter deposited.

Embodiments of the present invention also comprise a carbon-containing overcoat thereon, such as hydrogenated carbon. As in conventional practices, a lubricant topcoat could be applied on the carbon-containing overcoat.

Figure 2:
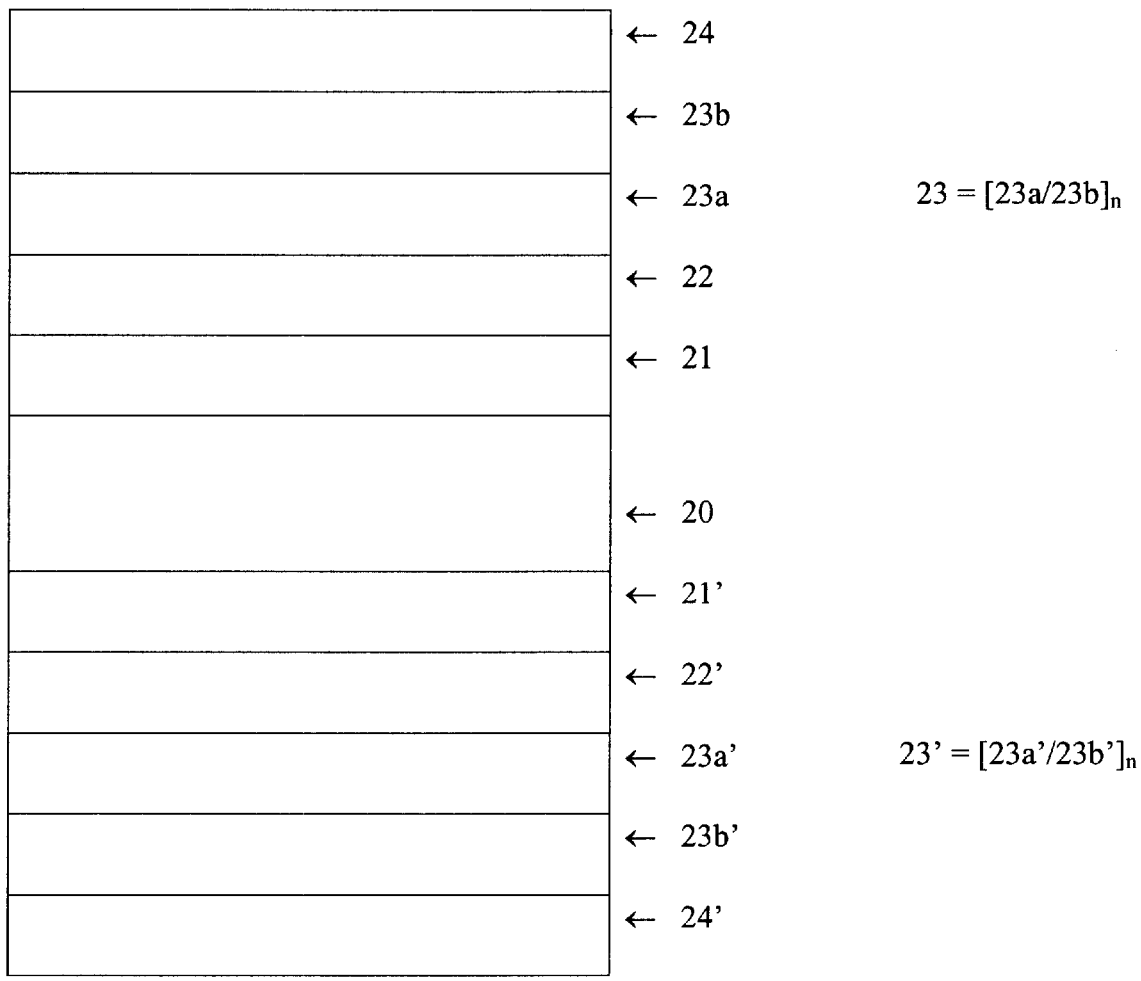
FIG. 2 schematically shows a magnetic recording medium structure comprising a superlattice multilayer in accordance with an embodiment of the present invention.

An embodiment of the present invention is schematically illustrated in FIG. 2 and comprises a substrate 20. Sequentially deposited on each side of substrate 20 is soft magnetic layer 21, 21', seedlayer 22, 22', multilayer superlattice 23, 23' comprising multiple bilayers of magnetic material 23a, 23a' and non-magnetic material 23b, 23b', and protective overcoat 24, 24'. Embodiments of the present invention also include a lubricant topcoat (not shown) deposited on protective overcoat 24, 24'.

In particular, FIG. 2 shows the cross section of an embodiment of a multilayer film structure for this invention, which include a soft magnetic layer, a seedlayer, a CoX/Pd (or CoX/Pt) multilayer, an overcoat layer, and a lubrication layer. The substrate material can be glass, ceramics (oxide, nitride, carbide), glass-ceramics, NiP/Al, metals, plastics, metal alloys or composite materials. The soft magnetic layer can be NiFe (81-19), NiFe (50-50), NiFe (45-55), CoNiFe, FeAl-Nitride, (e.g. 2 to 3 atomic percent Al) or any other high magnetic moment material. When the composition of NiFe is $Ni_{45}Fe_{55}$, the soft magnetic layer has a high saturation moment (Bsat) while the composition of $Ni_{81}Fe_{19}$ has zero magnetostriction and is good for the mechanical properties.

The Ar/Nitrogen and high power density processes can be applied on the listed material and other soft layer deposition. The thin seedlayer material can be Pd, Pt, Pd/Pt, Pt/Pd, or other metal, semi-metal, non-metal, oxide, nitride material. The multilayer media can produce perpendicular coercivity higher than 5000 Oe, if the seedlayer thickness higher than 20 Å. The bilayer superlattice has a structure from 5 to 100 bilayers of Co/Pd or Co/Pt or CoX/Pd, or CoX/Pt. Each Co (or CoX) layer has thickness ranged from 2 to 10 Å, preferably, 3 to 4 Å. Each Pd or Pt layer has thickness ranged from 3 to 20 Å, preferably, 7 to 13 Å. The overcoat can be a-C:H, a-C:HxNy, a-C:N, ion beam carbon, cathodic-arc-deposited carbon, or other SiNx, AlNx, SiC, and dual layer overcoat material, e.g. SiN/C, AlN/C, and SiC/C. The thickness of overcoat is in the range of 20 Å to 100 Å. The lubricant material can be HMW-Z-Dol, MMW-Z-Dol, Z-Tetraol, AM2001, PFPE, and the other mobile/solid lube mixture or solid lube coating to improve the head-disk interface. With the load/unload mechanism design, solid lube could be one of the candidates for the design of multilayer recording media of this invention.

Advantageously, the present invention could be conducted by sputter depositing the soft magnetic layer, the underlayer, the multilayer superlattice and protective overcoat in an apparatus comprising a plurality of sequentially spaced sputtering chambers. In particular, the multilayer superlattice could be formed by sequentially depositing a magnetic layer and a non-magnetic layer to form multiple bilayers of the magnetic/non-magnetic layers.

EXAMPLES

All samples were fabricated with direct current (DC) magnetron sputtering. Carbon films, if deposited, would be deposited by alternative current (AC) magnetron sputtering. A soft magnetic layer of NiFe is sputter deposited on a NiP/Al substrate using a gas ratio Ar/Nitrogen at 90:10 (i.e. 10% of nitrogen concentration). Since it was desired to measure the effect of NiFe layer on surface roughness, the disk samples of the Examples whose results are shown in Tables 1–3 did not have a Cr/carbon underlayer, a magnetic layer of [Co/Pd]n or [CoCr/Pd]n multilayer, and a carbon overcoat layer.

Optionally, however, as disclosed in co-pending U.S. application Ser. No. 09/634,253, filed Aug. 7, 2000, incorporated herein by reference, all samples could have [Co/Pd]n or [CoCr/Pd]n multilayer, wherein the bilayer number is n=20 and films sputtered at 20 mtorr, to prepare multilayer media. The cobalt thickness could be 3 Å and Pd thickness could be 10 Å.

It was found that the surface roughness of sputtered NiFe films improved as the power density of NiFe targets increases from 3.09 Watts/cm$^2$ (power at 1 kwatts) to 12.34 Watts/cm$^2$ (sputtering power at 4 kWatts). Here, the diameter of NiFe target is 8 inches. The area of target is 50.24 in$^2$ or 324 cm$^2$. The sputtering gas pressure is at 10 mtorr and the Ar/N$_2$ ratio at 90 to 10. Table 1 is the summary of the relationship between the surface average roughness and sputtering power density.

The surface parameters could be measured by atomic force microscope (AFM). The AFM used for this invention has the tradename NanoScope.® The statistics used by the AFM are mostly derived from ASME B46.1 ("Surface Texture: Surface Roughness, Waviness and Law") available from the American Society of Mechanical Engineers, which is incorporated herein by reference.

In particular, the surface parameters are defined as follows:

(1) Average surface roughness ($R_a$): Arithmetic average of the absolute values of the surface height deviations measured from a mean plane. The value of the mean plane is measured as the average of all the Z values within an enclosed area. The mean can have a negative value because the Z values are measured relative to the Z value when the microscope is engaged. This value is not corrected for tilt in the plane of the data; therefore, plane fitting or flattening the data will change this value.

$$R_a = [|Z_1| + |Z_2| + \ldots + |Z_n|]/N$$

(2) RMS: This is the standard deviation of the Z values within the enclosed area and is calculated as $$RMS = [\{\Sigma(Z_i - Z_{avg})^2\}/N]^{1/2}$$

where $Z_{avg}$ is the average of the Z values within the enclosed area, $Z_i$ is the current Z value, and N is the number of points within the enclosed area. The RMS value is not corrected for tilt in the plane of the data; therefore, plane fitting or flattening the data will change this value.

(3) Maximum height ($R_{max}$): This the difference in height between the highest and lowest points on the surface relative to the mean plane.

(4) $R_z$: This is the average difference in height between five highest peaks and five lowest valleys relative to the mean plane.

TABLE 1

The relationship between the Surface Roughness Parameters Ra, Rmax, and Rz and Sputtering Power and Power Density of NiFe Films.

| Power | 1 kW | 2 kW | 3 kW | 4 kW |
|---|---|---|---|---|
| Power Density | 3.09 w/cm$^2$ | 6.17 w/cm$^2$ | 9.26 w/cm$^2$ | 12.34 cm$^2$ |
| Ra, Rmax, and Rz for NiFe Film Thickness at 1000 Å | Ra: 1.6 nm Rmax: 12 nm Rz: 10 nm | Ra: 0.75 nm Rmax: 5 nm Rz: 4.5 nm | Ra: 0.5 nm Rmax: 3.6 nm Rz: 3.1 nm | Ra: 0.8 nm Rmax: 5 nm Rz: 4.5 nm |
| Ra, Rmax, and Rz for NiFe Film Thickness at 3000 Å | Ra: 5.2 nm Rmax: 33 nm Rz: 30 nm | Ra: 2.1 nm Rmax: 15 nm Rz: 13 nm | Ra: 1.6 nm Rmax: 12 nm Rz: 10 nm | Ra: 0.76 nm Rmax: 5.5 nm Rz: 4.1 nm |
| Ra, Rmax, and Rz for NiFe Film Thickness At 5000 Å | Ra: 3.7 nm Rmax: 27 nm Rz: 22 nm | Ra: 2.2 nm Rmax: 20 nm Rz: 15 nm | Ra: 1.6 nm Rmax: 10 nm Rz: 9.6 nm | Ra: 1.0 nm* Rmax: 7.8 nm Rz: 6.6 nm |

If NiFe films were sputtered five times with 1000 Å each time, the Ra was 0.7 nm. In order to show the material effect of process conditions on the surface roughness of the soft magnetic layer, the Ra values of soft magnetic layers, which were sputtered deposited under conditions shown in Table 2, were measured by AFM. The measured values of Ra are shown in Table 3.

TABLE 2

BPS Sputter power vs NiFe Surface Roughness AFM (Ra)

| Target | Sputter Power setting | | | | |
|---|---|---|---|---|---|
| NiFe Thickness | 1.0 kw | 2.0 kw | 3.0 kw | 4.0 kw | |
| 1000 Å | N1-1K | N1-2K | N1-3K | N1-4K | |
| Sputter Time (sec) | 30 | 15 | 11 | 7 | |
| AFM Ra (Å) | 16 | 8 | 5 | 8 | |
| 3000 Å | N3-1K | N3-2K | N3-3K | N3-4K | |
| Sputter Time (sec) | 90 | 45 | 33 | 21 | |
| AFM Ra (Å) | 52 | 21 | 16 | 8 | |
| 5000 Å | N5-1K | N5-2K | N5-3K | N5-4K | N5-4K5X |
| Sputter Time (sec) | 150 | 75 | 55 | 38 | 8 sec × 5 |
| AFM Ra (Å) | 37 | 22 | 16 | 11 | 7 |

TABLE 3

Disk conditions

| Disk ID | Sub | Cr/Carbon | NiFe(Å) | CO/Pd(N#) | Carbon(Å) | AFM Ra (Å) | Comment |
|---|---|---|---|---|---|---|---|
| N1-1K | NiP/Al | no | 1000 | no | no | 16 | BPS Sputter 30 sec, 1.0 KW, 10 mtorr Ar/N2 90/10 |
| N1-2K | NiP/Al | no | 1000 | no | no | 8 | BPS Sputter 15 sec, 2.0 KW, 10 mtorr Ar/N2 90/10 |
| N1-3K | NiP/Al | no | 1000 | no | no | 5 | BPS Sputter 11 sec, 3.0 KW, 10 mtorr Ar/N2 90/10 |
| N1-4K | NiP/Al | no | 1000 | no | no | 8 | BPS Sputter 7 sec, 4.0 KW, 10 mtorr Ar/N2 90/10 |
| N3-1K | NiP/Al | no | 3000 | no | no | 52 | BPS Sputter 90 sec, 1.0 KW, 10 mtorr Ar/N2 90/10 |
| N3-2K | NiP/Al | no | 3000 | no | no | 21 | BPS Sputter 45 sec, 2.0 KW, 10 mtorr Ar/N2 90/10 |
| N3-3K | NiP/Al | no | 3000 | no | no | 16 | BPS Sputter 33 sec, 3.0 KW, 10 mtorr Ar/N2 90/10 |
| N3-4K | NiP/Al | no | 3000 | no | no | 6 | BPS Sputter 21 sec, 4.0 KW, 10 mtorr Ar/N2 90/10 |
| N5-1K | NiP/Al | no | 5000 | no | no | 37 | BPS Sputter 150 sec, 1.0 KW, 10 mtorr Ar/N2 90/10 |
| N5-2K | NiP/Al | no | 5000 | no | no | 26 | BPS Sputter 75 sec, 2.0 KW, 10 mtorr Ar/N2 90/10 |
| N5-3K | NiP/Al | no | 5000 | no | no | 16 | BPS Sputter 55 sec, 3.0 KW, 10 mtorr Ar/N2 90/10 |
| N5-4K | NiP/Al | no | 5000 | no | no | 10 | BPS Sputter 38 sec, 4.0 KW, 10 mtorr Ar/N2 90/10 |
| N5-4K5X | NiP/Al | no | 5 × 1000Å(5000Å) | no | no | 7 | BPS Sputter 4.0 KW, 8 sec × 5, 10 mt Ar/N2 90/10 |

In Table 2, "BPS sputter" refers to a BPS sputtering machine, where "BPS" stands for Balzers Process Systems, Germany. In Table 3, "N1-1K," "N1-2K," "N1-3K" and "N1-4K," etc. refer to NiFe samples sputtered at 1 KW, 2 KW, 3 KW and 4 KW, respectively. Also, in Table 3, "Sub" refers to the substrate. The term "no" under column "Cr/Carbon" means that the disk samples of Table 3 did not contain a Cr/carbon-containing underlayer, which could optionally have been used. In the term "Co/Pd(N=)" the term "(N=)" refers to the number of layers of Co/Pd sublayers in a multi-layer medium. Since the effect of NiFe on surface roughness was desired to be measured independent of the effect of Co/Pd multilayers, the term "no" under column "Co/Pd(N=)" means that there were no layers of Co or Pd on the NiFe layer of the disks of Table 3. Similarly, since the effect of NiFe on surface roughness was desired to be measured independent of the effect of carbon overcoat layer, the term "no" under column "Carbon(Å)" means that there were no layers of carbon on the NiFe layer of the disks of Table 3.

The results in Tables 2 and 3 show process parameters and AFM roughness Ra data for various NiFe deposition conditions. The surface roughness of sputtered NiFe films could be reduced from 16 Å to 8 Å and 5 Å as the sputter power of NiFe increased from 1 KW to 2 and 3 KW, respectively. The high power sputtering NiFe sample has shown better surface roughness and low glide height performance.

What is claimed is:

1. A magnetic recording medium comprising:
   a substrate,
   a multilayer superlattice comprising a magnetic layer and a non-magnetic layer and
   a soft magnetic layer comprising interstitial nitrogen interposed between the substrate and the multilayer superlattice.

2. The magnetic medium according to claim 1, wherein the soft magnetic layer has a coercivity of about 0.1 Oe to about 50 Oe along an easy axis of magnetization.

3. The magnetic recording medium according to claim 1, wherein the multilayer superlattice comprises 5 to 100 bilayers of the magnetic layer and the non-magnetic layer.

4. The magnetic recording medium according to claim 3, wherein the bilayers are Co/Pd bilayers or Co/Pt bilayers.

5. The magnetic recording medium according to claim 1, wherein the magnetic layer has a thickness of about 2 Å to about 10 Å.

6. The magnetic recording medium according to claim 1, wherein the non-magnetic layer has a thickness of about 3 Å to about 20 Å.

7. The magnetic recording medium according to claim 1, wherein the soft magnetic layer has a thickness of about 1,000 Å to about 5,000 Å.

8. The magnetic recording medium according to claim 1, wherein the soft magnetic layer further comprises a material selected from the group consisting of NiFe, FeAl$_x$N$_y$, FeAlSi, CoZrNb and CoNiFe.

9. The magnetic recording medium according to claim 1, wherein the soft magnetic layer is a sputtered NiFe film comprising said interstitial nitrogen.

10. The magnetic recording medium according to claim 9, wherein the sputtered NiFe film has a decreasing surface roughness with an increasing power density of a NiFe target for sputtering said NiFe film.

11. A method of manufacturing a magnetic recording medium, the method comprising:

sputter depositing a soft magnetic layer comprising interstitial nitrogen on a substrate; and sputter depositing a multilayer superlattice comprising a magnetic layer and a non-magnetic layer on the soft magnetic layer.

12. The method of claim 11, wherein the soft magnetic layer has a coercivity of about 0.1 Oe to about 50 Oe along an easy axis of magnetization.

13. The method of claim 11, wherein the multilayer superlattice comprises 5 to 100 bilayers of the magnetic layer and the non-magnetic layer.

14. The method of claim 13, wherein the bilayers are Co/Pd bilayers or Co/Pt bilayers.

15. The method of claim 11, wherein the magnetic layer has a thickness of about 2 Å to about 10 Å.

16. The method of claim 11, wherein the non-magnetic layer has a thickness of about 3 Å to about 20 Å.

17. The method of claim 11, wherein the soft magnetic layer has a thickness of about 1,000 Å to about 5,000 Å.

18. The method of claim 11, wherein the soft magnetic layer further comprises a material selected from the group consisting of NiFe, $FeAl_xN_y$, FeAlSi, CoZrNb and CoNiFe.

19. The method of claim 18, wherein the soft magnetic layer is a sputtered NiFe film comprising said interstitial nitrogen and the sputtered NiFe film has a decreasing surface roughness with an increasing power density of a NiFe target for sputtering said NiFe film.

* * * * *